US006507101B1

(12) United States Patent
Morris

(10) Patent No.: US 6,507,101 B1
(45) Date of Patent: Jan. 14, 2003

(54) LOSSY RF SHIELD FOR INTEGRATED CIRCUITS

(75) Inventor: Terrel L. Morris, Garland, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/277,717

(22) Filed: Mar. 26, 1999

(51) Int. Cl.[7] .......................... H05K 7/20; H01L 23/48; H01L 23/34; H01L 23/28
(52) U.S. Cl. ...................... 257/706; 257/659; 257/660; 257/790; 257/921; 257/738; 257/737; 257/712; 257/713; 257/717; 257/718; 257/726; 257/727; 257/668; 257/778; 361/715; 361/704; 361/719; 361/818
(58) Field of Search .................. 257/706, 717, 257/720, 726, 727, 718, 719, 722, 713, 712, 675, 737, 738, 778, 668, 660, 921, 659; 361/715, 704, 719, 818

(56) References Cited

U.S. PATENT DOCUMENTS

| | | | | |
|---|---|---|---|---|
| 4,769,682 A | * | 9/1988 | Yang et al. | |
| 4,840,840 A | * | 6/1989 | Flynn et al. ................. | 428/283 |
| 4,886,240 A | * | 12/1989 | Rich ........................... | 250/352 |
| 4,890,083 A | * | 12/1989 | Trnkler et al. .............. | 335/301 |
| 4,925,024 A | * | 5/1990 | Ellenberger et al. ........ | 206/328 |
| 4,953,922 A | * | 9/1990 | Granqvist ................... | 428/919 |
| 5,208,732 A | * | 5/1993 | Baudouin et al. ........... | 257/713 |
| 5,289,346 A | * | 2/1994 | Carey et al. ................ | 257/778 |
| 5,296,739 A | * | 3/1994 | Heibronner et al. ......... | 257/687 |
| 5,406,117 A | * | 4/1995 | Dlugokecki et al. ........ | 257/659 |
| 5,566,052 A | * | 10/1996 | Hughes ....................... | 257/713 |
| 5,703,753 A | * | 12/1997 | Mok ........................... | 257/712 |
| 5,707,715 A | * | 1/1998 | deRochemont et al. ..... | 428/210 |
| 5,777,847 A | * | 7/1998 | Tokuno et al. .............. | 257/713 |
| 5,866,953 A | * | 2/1999 | Akam et al. ................. | 257/790 |

(List continued on next page.)

FOREIGN PATENT DOCUMENTS

JP            1-124243    *   5/1989

OTHER PUBLICATIONS

Chomerics Company Catalogue; Soft–Shield, Low Closure Force EMI Gaskets, Copyright Chomerics Parker Hannifin Corp., 1997, pp. 1–16.
Chomerics Company Catalogue; EMI Shielding For Commercial Electronics, Dec. 199, pp. 1–124 (includes cover and inside pages not numbered).

*Primary Examiner*—Alexander O. Williams
(74) *Attorney, Agent, or Firm*—Alexander J. Neudeck; David W. Boyd

(57) ABSTRACT

A low-cost EMI shield that fits around an integrated circuit package to absorb electromagnetic energy and dissipate it as heat. The shield is not ohmically conductive so it may contact electrically active conductors without affecting the operation of the circuit. EMI is prevented from being radiated by and around an integrated circuit package by a perimeter of material that is lossy to high-frequency electromagnetic currents. This perimeter is fitted around an integrated circuit package such that the gap between a heat sink or other top conductor and the printed circuit board is completely closed by the lossy material. This provides not only a line-of-sight obstruction to RF currents, but also provides a lossy return path to close the circuit loop for currents on the skin of the heat sink. Since the material is lossy, rather than purely conductive, it can be used with a less than perfect ground attachment. Grounding is accomplished by the placement of the lossy material adjacent to the printed circuit board, allowing capacitive coupling to close the loop. The position of the lossy material is secured by a friction fit, adhesive, or self-locking or retaining features built into the lossy material.

12 Claims, 4 Drawing Sheets

U.S. PATENT DOCUMENTS

| | | | | |
|---|---|---|---|---|
| 5,985,697 A | * | 11/1999 | Chaney et al. | 257/718 |
| 6,018,460 A | * | 1/2000 | Borowiec et al. | 361/704 |
| 6,063,730 A | * | 5/2000 | Simpson et al. | 503/227 |
| 6,075,700 A | * | 6/2000 | Houghton et al. | 257/718 |
| 6,087,682 A | * | 7/2000 | Ando | 257/178 |
| 6,087,730 A | * | 7/2000 | McGarvey et al. | 257/766 |
| 6,114,761 A | * | 9/2000 | Mertol et al. | 257/722 |
| 6,122,167 A | * | 9/2000 | Smith et al. | 361/687 |

* cited by examiner

LOSSY RF SHIELD FOR INTEGRATED CIRCUITS

FIELD OF THE INVENTION

The present invention relates generally to the control of electromagnetic interference from electronic devices and more particularly to the control of electromagnetic interference generated or present in the region of an integrated circuit.

BACKGROUND OF THE INVENTION

Electromagnetic interference (EMI) is a generic term for unwanted interference energies either conducted as currents or radiated as electromagnetic fields. EMI can emanate from electronic devices in several ways. Generally, voltages and currents in board mounted, integrated circuits create electric and magnetic fields that radiate from the device. EMI radiating from such devices will vary in field strength and impedance according to the shape and orientation of the conductors, the distance from the conductors to any shielding provided by circuit components or by coupling to circuit components.

Since many electronic devices and integrated circuits operate by generating signals at rates in excess of a million Hertz, radiating EMI will extend into the radio frequency spectrum and can cause significant interference with radio and television signals. The United States Federal Communications Commission has promulgated rules and procedures requiring the minimization and regulation of EMI by manufacturers of electronic devices. Under such regulations, EMI must be limited for certain devices to particular radiated power ranges depending on the frequency of the EMI signal. In lieu of the problems surrounding ESI and the need to comply with government regulations, various schemes have been proposed for limiting EMI. One typical scheme has been to provide a conductive enclosure to an electronic device so that EMI field lines will terminate on such enclosure. Unfortunately, conductive enclosures which contain the entire product or parts of the product can be very expensive. Furthermore, these conductive enclosures are typically designed concurrently with the electronic device so that they if they need to be redesigned due to EMI problems it causes additional expense and time to market delays. Finally, these enclosures can actually redirect electromagnetic energy causing further EMI problems.

Accordingly, there is a need in the art for a low-cost EMI shield that can be added to a product with a problem integrated circuit. Such a shield should be easy to design and produce. Such a shield should also be capable of being added to the device after the design of the product is substantially complete without requiring significant redesign of the product. This allows the shield to be added to the device design after prototypes have been constructed and EMI measurements taken on these prototypes.

SUMMARY OF THE INVENTION

The present invention provides a low-cost EMI shield that fits around an integrated circuit package to absorb electromagnetic energy and dissipate it as heat. The shield has a simple design and is not ohmically conductive so it may be added to designs with little or no re-design of the product.

The present invention reduces the EMI radiated from an integrated circuit package with a perimeter of material that presents a lossy interface to high-frequency electromagnetic currents and doesn't significantly conduct low frequency and direct current (DC). This perimeter is fitted around an integrated circuit package such that the gap between a heat sink or other top conductor and the printed circuit board is completely closed by the lossy material. The position of the lossy material may be secured by a friction fit, adhesive, or self-locking or retaining features built into the lossy material.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 1A:
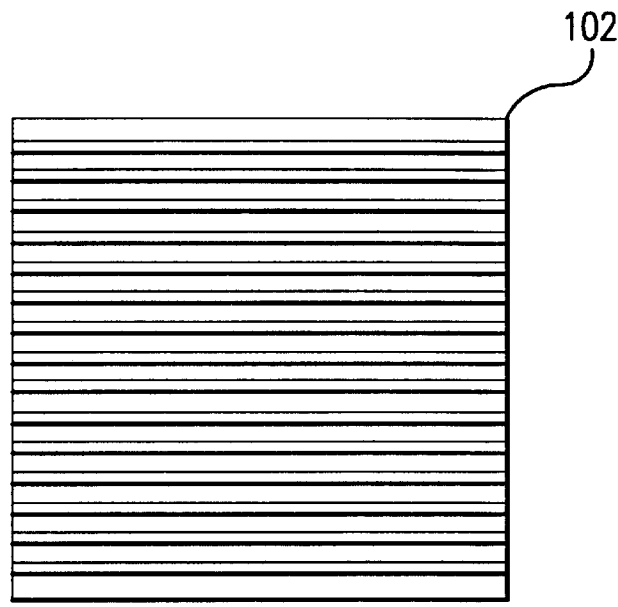
FIG. 1A is a top view of an integrated circuit package with a heat sink.
Figure 1B:
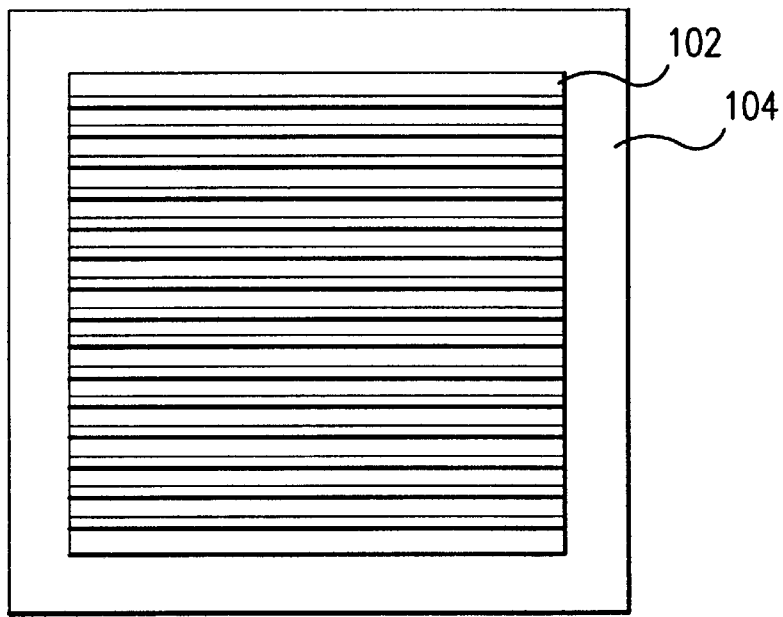
FIG. 1B is a top view of an integrated circuit package with a perimeter of lossy material closing the gap between the heat sink and the printed circuit board.

FIG. 1A is a top view of an integrated circuit package with a heat sink 102. FIG. 1B is a top view of an integrated circuit package with a perimeter of lossy material 104 closing the gap between the heat sink 102 and the printed circuit board.

The perimeter of lossy material 104 is shown as being square in FIG. 1B. This is because the shape of the heat sink 102 in FIG. 1B is square. The perimeter of lossy material 104 could be any shape that conforms approximately to the shape of the heat sink 102 forming a fit with the perimeter of the heat sink. Heat sink 102 should be a good conductor of electromagnetic waves so that it provides EMI shielding for the top of the integrated circuit package. Alternately, heat sink 102 could be replaced by a metal plate or other structure not specifically designed to radiate heat, but still capable of providing EMI shielding for the top of the integrated circuit package. Shielding for the bottom of the integrated circuit package may be provided by the planes of conductors in or on the printed circuit board. In a preferred embodiment, the perimeter of lossy material is made from a material that is not rigid. In other words, the perimeter of lossy material is made from a conformable material so that it can be compressed and shaped by mechanical forces to form a good fit against the rigid printed circuit board and against the rigid heat sink so that few or no gaps exist along these interfaces. This should be true even though the dimensions of the internal surface of perimeter of lossy material doesn't exactly match the dimensions of the perimeter of the heat sink, or the printed circuit board.

The lossy material provides a line-of-sight obstruction to RF currents and a lossy return path to close the circuit loop for currents on the skin of the heat sink. Since the material is lossy, rather than purely conductive, it can be used with a less than perfect ground attachment. In the preferred embodiment, grounding is accomplished by the placement of the lossy material adjacent or against the printed circuit board, allowing capacitive coupling to close the loop. Because the lossy material does not conduct low frequency or DC currents very well, it is described as being not ohmically conductive. This property allows the shield to be added to existing designs without requiring implementation-specific pad patterns, holes, or other features to exist on the printed circuit board or on the shield. It can be added to existing designs which may not have room for such features. Because it is not ohmically conductive, the shield can be placed in contact with traces or conductors without affecting the function of the circuit it is used on. Finally, this invention provides a loss mechanism that turns unwanted RF energy to heat, rather than merely redirecting it.

Figure 2:
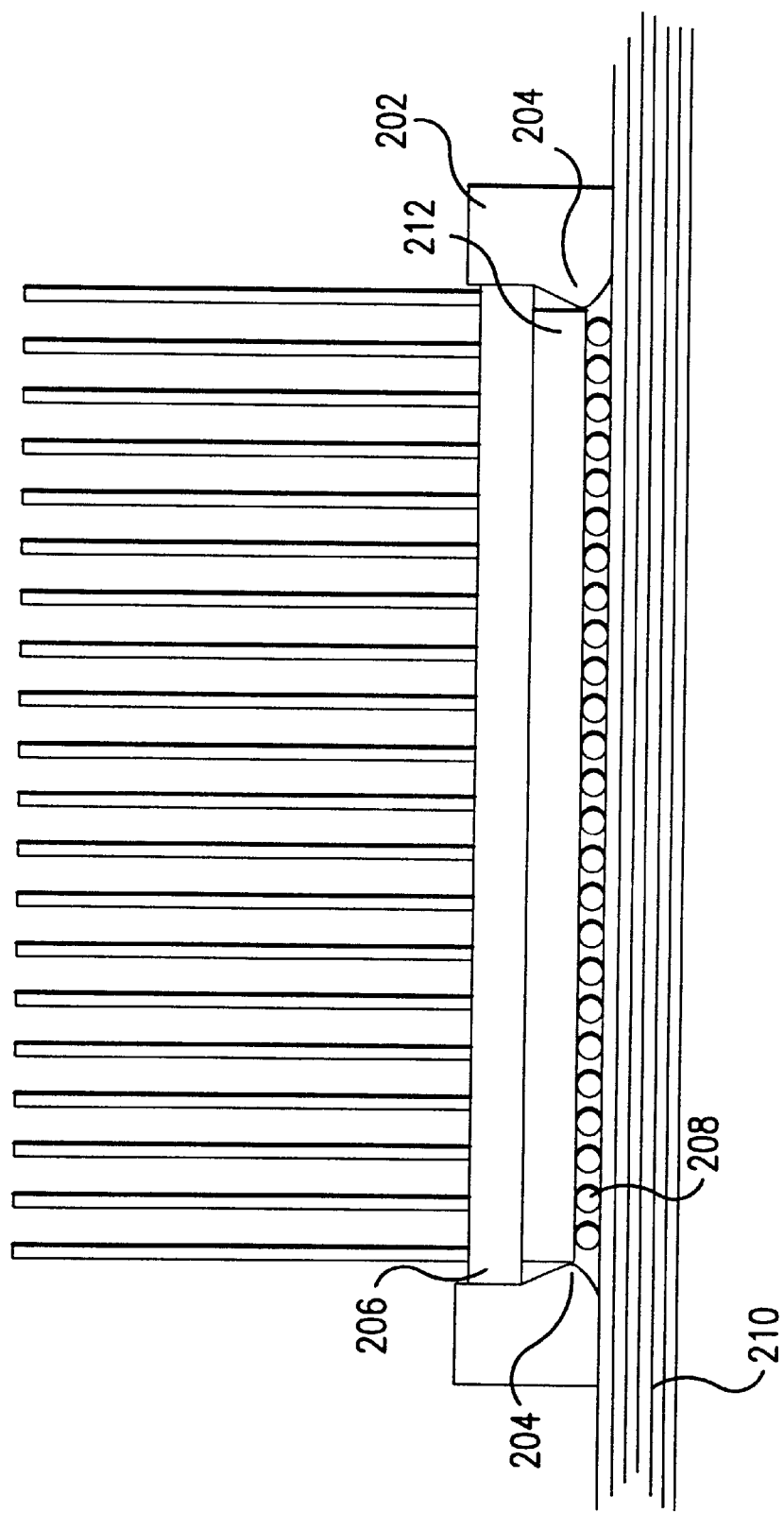
FIG. 2 is a side view of an integrated circuit ball grid array (BGA) package with a perimeter of lossy material having a self-locking feature.

FIG. 2 is a side view of an integrated circuit ball grid array (BGA) package with a perimeter of lossy material having a self-locking feature. In FIG. 2 heat sink 206 is in thermal contact with the top of ball grid array package 212. The solder balls 208 provide electrical contact between BGA package 212 and the conductors of printed circuit board 210. Heat sink 206 is wider than BGA package 212 so that it projects outward from the edges of BGA package 212. This forms a lip that engages self-locking feature 204 so that the perimeter of lossy material 202 is held in place. Locking feature 204 is a protrusion on the interior surface of the perimeter of lossy material such that either the locking feature 204 or the perimeter of lossy material 202 must be deformed to remove the perimeter of lossy material 202. The perimeter of lossy material 202 is held against printed circuit board 210 and heat sink 206 so that few or no gaps exists that would allow electromagnetic waves to escape the cavity formed by the heat sink 206, printed circuit board 210, and perimeter of lossy material 202.

Figure 3:
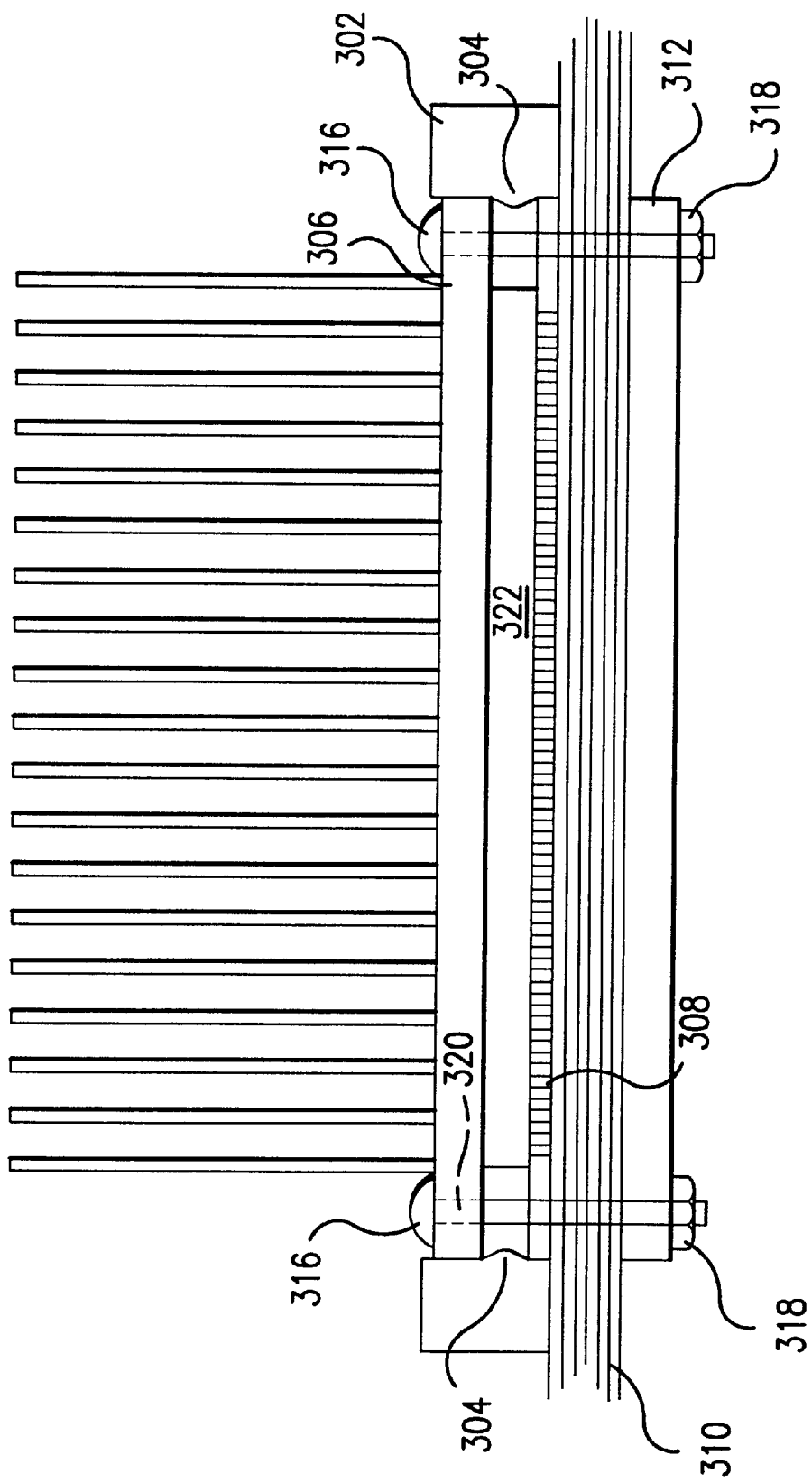
FIG. 3 is a side view of an integrated circuit pin grid array (PGA) package with a perimeter of lossy material having a retaining feature.

FIG. 3 is a side view of an integrated circuit pin grid array (PGA) package with a perimeter of lossy material having a retaining feature. In FIG. 3 heat sink 306 is in thermal contact with the top of pin grid array package 322. Pins 308 provide electrical contact between PGA package 322 and the conductors of printed circuit board 310. Heat sink 306 is wider than PGA package 322 so that it projects outward from the edges of PGA package 322. This forms a lip that engages retaining feature 304 so that the perimeter of lossy material 302 is held in place. Retaining feature 304 is a protrusion on the interior surface of the perimeter of lossy material such that either the retaining feature 304 or the perimeter of lossy material 302 must be deformed slightly to remove the perimeter of lossy material 302. The perimeter of lossy material 302 is held against printed circuit board 310 and heat sink 306 so that few or no gaps exists that would allow electromagnetic waves to escape the cavity formed by the heat sink 306, printed circuit board 310, and perimeter of lossy material 302. Heat sink 306 may be additionally held in thermal contact with PGA 322 by bolts 316 that are disposed through holes 320 in heat sink 306. Bolts 316 also pass through holes in printed circuit board 310 to be secured by nuts 318 in contact with plate 312. Plate 312 is an optional plate that serves to spread the mechanical forces associated with holding heat sink 306 in place over a large area.

Figure 4A:
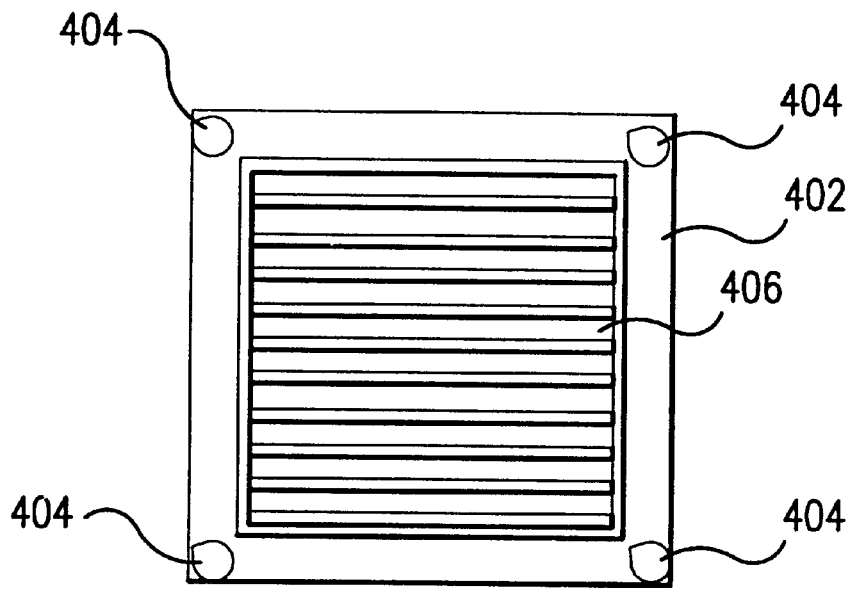
FIG. 4A is a top view of an integrated circuit package with a perimeter of lossy material being held in place by adhesive.
Figure 4B:
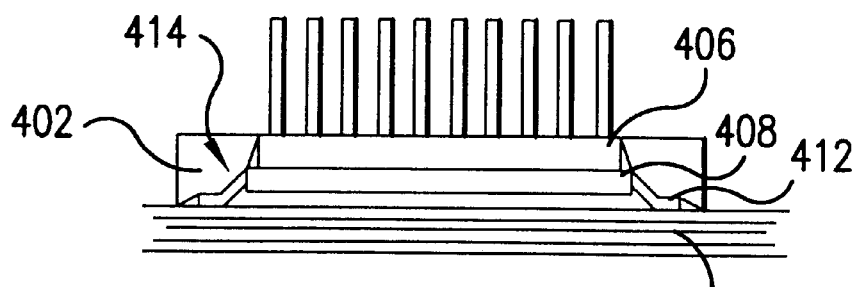
FIG. 4B is a side view a quad flat-pack (QFP) integrated circuit package with a perimeter of lossy material being held in place by adhesive.

FIG. 4A is a top view of an integrated circuit package with a perimeter of lossy material being held in place by adhesive. FIG. 4B is a side view a quad flat-pack (QFP) integrated circuit package with a perimeter of lossy material being held in place by adhesive. In FIG. 4A and 4B, heat sink 406 is in thermal contact with integrated circuit package 408. Unlike FIGS. 2 and 3, in FIG. 4 the heat sink 406 does not project outward beyond the edges of integrated circuit package 408. Adhesive 404 holds the perimeter of lossy material 402 in place. Adhesive 404 is shown as four spots of adhesive in FIG. 4. This is an examplary application of adhesive 404. Adhesive 404 could be applied in any number of ways well known in the art including, but not limited to, fillets, or a larger or smaller number of spots. Furthermore, the adhesive could also be a lossy material. In particular, a lossy material made from "loaded" silicone rubber described below could be used as an adhesive with lossy properties. Also, adhesive could be used to secure the perimeter of lossy material around other types of packages. Most notably, adhesive could be used to secure the perimeter of lossy material in place against the printed circuit board and around the packages shown in FIGS 1B, 2, and 3. The adhesive could be used by itself, or in conjunction with the self-locking or retaining features described above. In the case where the adhesive is used by itself, then the heat sink would not need to protrude or project outward beyond the edge of the package.

FIG. 4B shows a quad flat-pack as package 408. Since the leads 412 of a quad flat pack package extend outward from the body of package 408 the interior profile 414 of the perimeter of lossy material 402 is chosen so that it conforms to the perimeter of heat sink 406 along the top but still contacts printed circuit board 410 along the bottom without damaging leads 412.

Thus in FIGS. 1B, 2, 3, 4A, and 4B an RF containment mechanism is constructed using the existing shield qualities of the heat sink for the upper RF confinement, the existing shield qualities of the printed circuit board planes for the lower RF confinement, and the lossy material around the perimeter to complete the enclosure.

The lossy material used in the above described configurations provides not only a line-of-sight obstruction to RF currents, but also provides a lossy return path to close the circuit loop for currents on the skin of the heat sink. Since the material is lossy, rather than purely conductive, it can be used with a less than perfect ground attachment. In the preferred embodiment, grounding is accomplished by the placement of the lossy material adjacent to the printed circuit board, allowing capacitive coupling to close the loop.

Examples of lossy materials for these applications include "loaded" silicone rubber compounds, such as those produced by Chomerics, a division of Parker-Hannifin, located in Woburn, Mass. To satisfy the needs of the present invention, silicone rubber can be impregnated with a wide variety of conductive and semi-conductive materials, including nickel, copper, silver, and carbon. Depending on the material selected and the ratio of non-conductive silicone rubber to semi-conductive loaded material, a lossy material can be produced which exhibits lossy behavior at the desired frequencies while presenting a low conductivity on the surface. The conductivity on the surface can be made low enough that it can directly contact active circuit traces without significantly affecting the functioning of the circuit. When this is the case, these materials are said to be not ohmically conductive.

Another suitable group of materials, such as carbon-loaded plastic foams, present a loss element to high frequency RF energy, while presenting a very low surface conductivity to DC currents. These materials, manufactured by 3M Corporation, St. Paul, Minn. and DuPont Corporation, Wilmington, Del., are commonly used in the control of static electricity. To an ohmmeter, they typically present a resistance greater than one megohm so they are not considered ohmically conductive.

Lossy materials that are loaded with magnetic compounds, particularly ferrites are also suitable. An example of this type of material is Eccosorbo FGM, produced by Emerson & Cuming Microwave Products, N.V. in Westerlo, Belgium. This company also manufactures other suitable materials such as lossy foam materials, lossy urethane sheet materials, and lossy multi-layer materials that enable the core of the material to act primarily as a low-resistance element, while the outside of the material presents a good insulator.

Since all these materials are not ohmically conductive, all of them can be placed in direct contact with pins of ICs without causing short circuits.

Although several specific embodiments of the invention have been described and illustrated, the invention is not to be limited to the specific forms or arrangements of parts so described and illustrated. For example, the invention has been illustrated with three types of integrated circuit packages. However, other types of packages could benefit from this type of shielding. Other types of packages that could benefit from this type of shielding include, but are not limited to leadless chip carriers (LCC) and dual in-line packages (DIP's). The invention is limited only by the claims.

What is claimed is:

1. A shield for containing electromagnetic radiation, comprising:
   a perimeter of lossy material adapted to substantially enclose a gap between a heat sink mounted on an integrated circuit and a surface of a printed circuit board, wherein said perimeter of lossy material is also adapted to conform to the perimeter of said heat sink when said heat sink is mounted on said integrated circuit package, and wherein said perimeter of lossy material is also adapted to conform to said surface of a printed circuit board when said integrated circuit package is mounted on said surface of said printed circuit board, and wherein said perimeter of lossy material is comprised of a shielding material that absorbs electromagnetic radiation and is not ohmically conductive.

2. The shield of claim 1 wherein said perimeter of lossy material has a protrusion on an inner surface of that engages said heat sink to hold said perimeter of lossy material in place conformed against said surface of said printed circuit board.

3. The shield of claim 1 wherein said perimeter of lossy material is held in place conformed against said heat sink by an adhesive between said perimeter of lossy material and said surface of said printed circuit board.

4. The shield of claim 3 wherein said adhesive absorbs electromagnetic radiation.

5. An electromagnetic shield, comprising:
   a perimeter of non-ohmically conductive electromagnetic absorptive material around an integrated circuit package mounted on a printed circuit board, said perimeter of electromagnetic absorptive material having a first surface and a second surface, said first surface being conformable to an outer perimeter of a heat sink and said second surface being conformable to contact said printed circuit board such that said perimeter of electromagnetic absorptive material spans a gap between said outer perimeter of said heat sink and said printed circuit board.

6. The electromagnetic shield of claim 5 wherein said perimeter of electromagnetic absorptive material has a protrusion on an inner surface of that engages said heat sink to hold said perimeter of electromagnetic absorptive material in place conformed against said surface of said printed circuit board.

7. The electromagnetic shield of claim 5 wherein said perimeter of electromagnetic absorptive material is held in place conformed against said heat sink by an adhesive between said perimeter of electromagnetic absorptive material and said surface of said printed circuit board.

8. The electromagnetic shield of claim 7 wherein said adhesive absorbs electromagnetic radiation.

9. A shield for containing electromagnetic radiation, comprising:
   a printed circuit board with a first substantially planar surface, the edges of said first substantially planar surface being defined by a first perimeter;
   a heat sink with a second substantially planar surface, said second substantially planar surface being disposed parallel to said first substantially parallel surface to form a gap between said first substantially planar surface and said second substantially planar surface;
   a skirt of lossy material conforming to said first perimeter and said second substantially planar surface to form an enclosed cavity.

10. The shield of claim 9 wherein said skirt has an inner surface on the inside of said enclosed cavity and said inner surface has a protrusion on said inner surface that engages said heat sink to hold said skirt conformed against said first substantially planar surface.

11. The shield of claim 9 wherein said skirt is held against said first substantially planar surface with an adhesive.

12. The shield of claim 9 wherein there is an integrated circuit disposed inside said enclosed cavity.

* * * * *